United States Patent
Lu et al.

(10) Patent No.: US 11,760,695 B2
(45) Date of Patent: Sep. 19, 2023

(54) REMOVING COLORIZATION ON SILICON CARBIDE CERAMIC MATRIX COMPOSITES

(71) Applicant: Hamilton Sundstrand Corporation, Charlotte, NC (US)

(72) Inventors: Weiming Lu, Akron, OH (US); Jun Nable, Hamden, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 406 days.

(21) Appl. No.: 16/999,805

(22) Filed: Aug. 21, 2020

(65) Prior Publication Data

US 2022/0055953 A1 Feb. 24, 2022

(51) Int. Cl.
*C04B 35/626* (2006.01)
*C04B 35/628* (2006.01)
*C04B 35/83* (2006.01)

(52) U.S. Cl.
CPC .... *C04B 35/6265* (2013.01); *C04B 35/62863* (2013.01); *C04B 35/62884* (2013.01); *C04B 35/83* (2013.01); *C04B 2235/5244* (2013.01); *C04B 2235/5248* (2013.01); *C04B 2235/614* (2013.01); *C04B 2235/656* (2013.01); *C04B 2235/6586* (2013.01)

(58) Field of Classification Search
CPC .................. C04B 35/62863; C04B 35/62884
See application file for complete search history.

(56) References Cited

U.S. PATENT DOCUMENTS

| | | | |
|---|---|---|---|
| 6,197,374 B1 | 3/2001 | Huttinger et al. | |
| 7,820,534 B2 * | 10/2010 | Sawada | H01L 29/66068 438/758 |
| 7,892,646 B1 * | 2/2011 | Rudolph | C23C 16/045 428/408 |
| 10,221,104 B2 | 3/2019 | Nakamura et al. | |
| 10,544,063 B2 | 1/2020 | Smyth et al. | |
| 2003/0175453 A1 | 9/2003 | Steffier | |
| 2005/0181192 A1 | 8/2005 | Steffier | |

(Continued)

FOREIGN PATENT DOCUMENTS

| | | |
|---|---|---|
| CA | 2271177 A1 | 11/1999 |
| CN | 106342035 B | 1/2014 |

(Continued)

OTHER PUBLICATIONS

Extended European Search Report for European Patent Application No. 21192641.5, dated Jan. 20, 2022, 6 pages.

*Primary Examiner* — Robert A Vetere
(74) *Attorney, Agent, or Firm* — Kinney & Lange, P.A.

(57) ABSTRACT

A method of depositing silicon carbide on a preform to form a ceramic matrix composite comprises placing the preform into a reaction vessel, removing air from the reaction vessel and backfilling the reaction vessel with an inert gas to an operating pressure. The reaction vessel and the preform are heated to an operating temperature. A carrier gas and precursor materials are heated to a preheat temperature outside of the reaction vessel. The carrier gas and the precursor materials are introduced to the reaction vessel in a specified ratio. Off gasses, the precursor materials that are unspent, and the carrier gas are removed from the reaction vessel to maintain the specified ratio of the precursor materials in the reaction vessel.

18 Claims, 2 Drawing Sheets

(56) References Cited

U.S. PATENT DOCUMENTS

| | | | | |
|---|---|---|---|---|
| 2016/0297716 A1* | 10/2016 | Nakamura | ............... | C04B 35/80 |
| 2016/0305015 A1 | 10/2016 | Nakamura et al. | | |
| 2018/0030593 A1* | 2/2018 | Policandriotes | .......... | F25B 9/12 |
| 2019/0127280 A1* | 5/2019 | Zhan | ................. | C04B 35/62222 |
| 2020/0255351 A1 | 8/2020 | She et al. | | |

FOREIGN PATENT DOCUMENTS

| | | | |
|---|---|---|---|
| CN | 108264884 | A | 7/2018 |
| EP | 0955281 | B1 | 11/2003 |
| KR | 101038475 | B1 | 6/2011 |

* cited by examiner

REMOVING COLORIZATION ON SILICON CARBIDE CERAMIC MATRIX COMPOSITES

BACKGROUND

This invention relates to processes to create ceramic matrix composite (CMC) materials and, in particular, to chemical vapor infiltration (CVI) and chemical vapor deposition (CVD) processes for densifying preforms to create silicon carbide CMC materials.

CVI is performed on porous fiber preforms to form CMC materials. The porous fiber preform can be made of carbon fibers, silicon carbide fibers, or any other suitable fibers. CVD is performed on materials with solid surfaces. Preforms used in CVD can be made of any material that can be coated through a CVD process, such as carbon, silicon carbide, metal oxides, and glass. During a CVI or CVD process, a preform is placed within a reaction vessel that is then depressurized and heated. The silicon carbide precursor materials that densify the preform flow into the reaction vessel, are vaporized inside of the reaction vessel, and slowly deposit silicon carbide at an atomic level on the surface of the preform. The silicon carbide precursor materials coat the exposed surfaces of the preform and densify the preform into a CMC material. Numerous precursor materials can be used during CVI and CVD processes to form various CMC materials.

Silicon carbide CMC materials are used in applications where end products are exposed to high-temperatures, such as in brakes or engines. When CVI and CVD processes are used to create a silicon carbide CMC material, a yellow or multi-colored surface develops on the CMC material due to a buildup of excess free silicon on the surface. This yellow or multi-colored surface negatively affects the performance of finished silicon carbide CMC materials because it chemically changes the silicon carbide composition, reducing the mechanical, thermal, and chemical properties of the CMC material.

SUMMARY

A method of depositing silicon carbide on a preform to form a ceramic matrix composite comprises placing the preform into a reaction vessel, removing air from the reaction vessel and backfilling the reaction vessel with an inert gas to an operating pressure. The reaction vessel and the preform are heated to an operating temperature. A carrier gas and precursor materials are heated to a preheat temperature outside of the reaction vessel. The carrier gas and the precursor materials are introduced to the reaction vessel in a specified ratio. Off gasses, the precursor materials that are unspent, and the carrier gas are removed from the reaction vessel to maintain the specified ratio of the precursor materials in the reaction vessel.

A method of depositing silicon carbide on a preform to form a ceramic matrix composite comprises placing the preform into a reaction vessel and filling the reaction vessel with an inert gas to reach an operating pressure. The reaction vessel and the preform are heated to an operating temperature. Hydrogen and methyltrichlorosilane are introduced into the reaction vessel in a specified ratio. The specified ratio is a volumetric ratio of the hydrogen to the methyltrichlorosilane and is between 15 parts hydrogen to 1 part methyltrichlorosilane and 65 parts hydrogen to 1 part methyltrichlorosilane.

A method of depositing silicon carbide on a preform to form a ceramic matrix composite comprises placing the preform into a reaction vessel and filling the reaction vessel with an inert gas to reach an operating pressure. The reaction vessel and the preform are heated to an operating temperature. Precursor materials are introduced into the reaction vessel in a specified ratio for a first time interval. The flow of the precursor materials to the reaction vessel is stopped while the precursor materials that are unspent are removed from the reaction vessel for a second time interval. For a third time interval, the precursor materials are introduced to the reaction vessel in the specified ratio.

DETAILED DESCRIPTION

Figure 1:
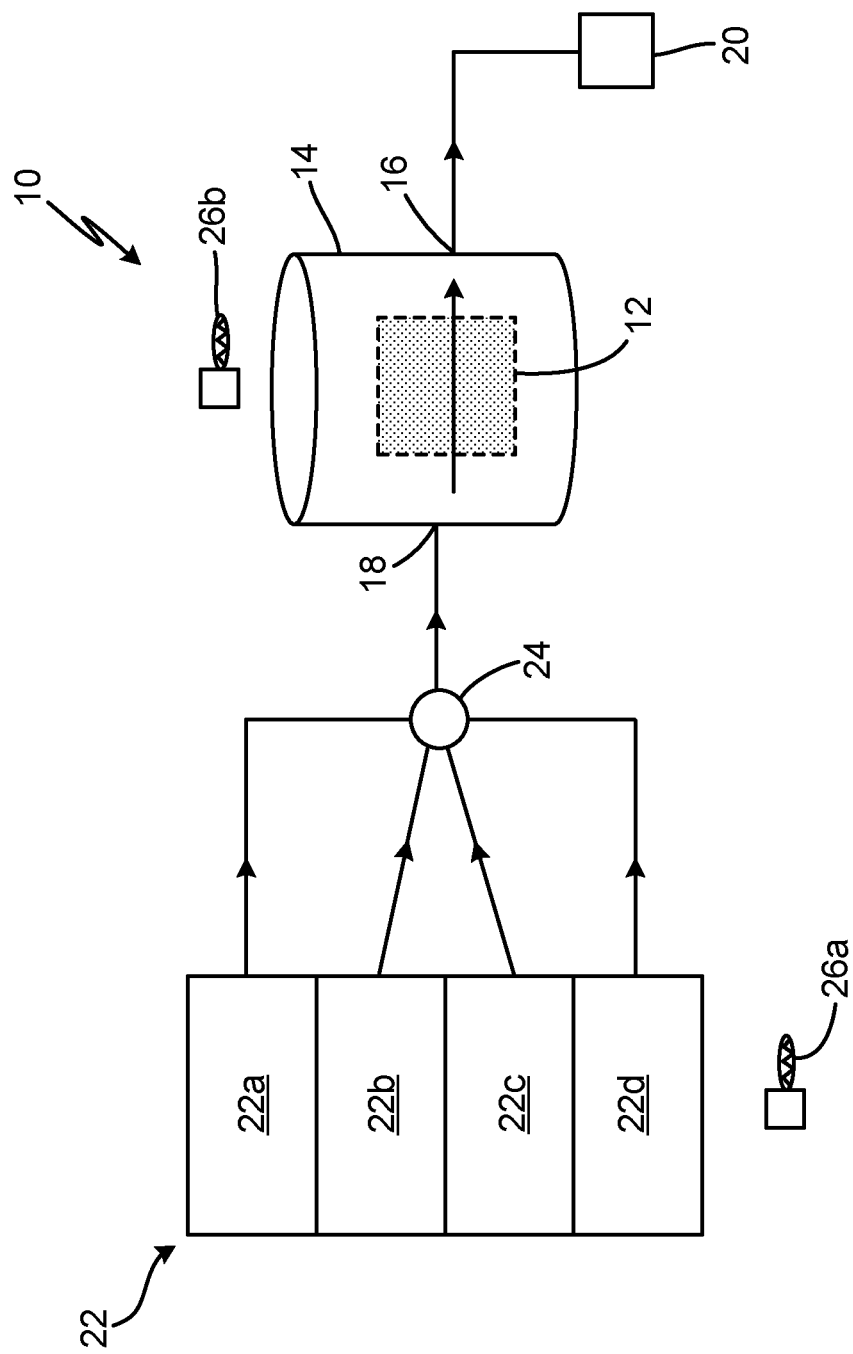
FIG. 1 is a schematic of a system for conducting CVI or CVD.
Figure 2:
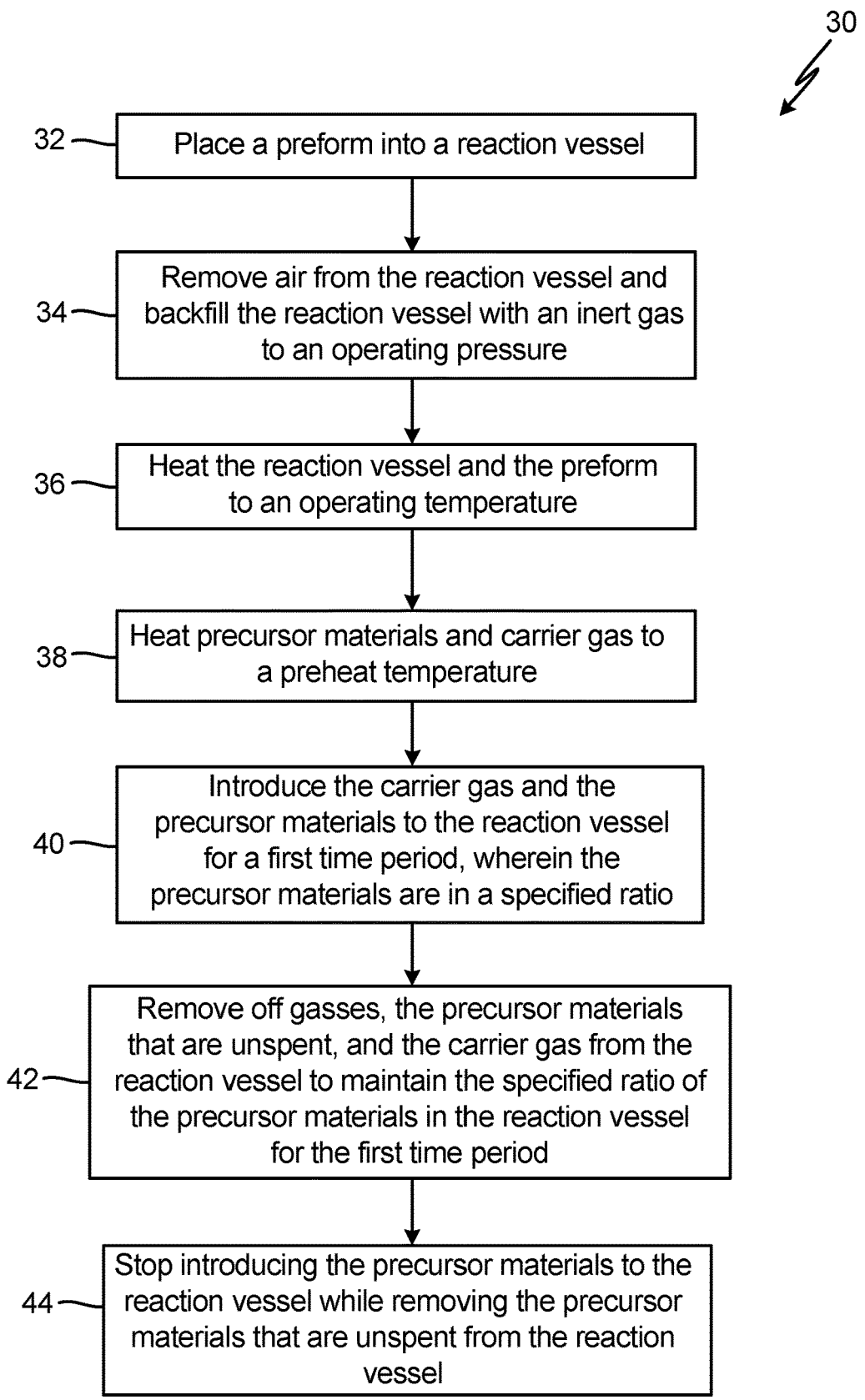
FIG. 2 is a flow chart showing the steps of a CVI or CVD process to reduce colorization on the surface of CMC products.

FIG. 1 shows a schematic of system 10 for conducting CVI or CVD that can be used to perform the steps shown in the flow chart of FIG. 2. FIG. 1 includes system 10, preform 12, reaction vessel 14, which includes exit 16 and entrance 18, vacuum pump 20, gas source tanks 22, including first tank 22a, second tank 22b, third tank 22c, and fourth tank 22d. FIG. 1 also includes flow meter 24, and heaters 26, including first heater 26a and second heater 26b.

System 10 can be used to efficiently carry out and control a CVI process or a CVD process. To begin a CVI process or a CVD process, preform 12 is removably placed inside reaction vessel 14. For a CVI process, preform 12 is a porous fabric woven from silicon carbide fibers, carbon fibers, or any other suitable fibers. Preform 12 densifies during the CVI process. For a CVD process, preform 12 is made of any material that can have a silicon carbide coating on its surface, such as carbon, silicon carbide, metals, metal alloys, and glass. Preform 12 has a roughened solid surface. Roughening the solid surface of preform 12 increases the porosity of preform 12 and the surface area that can react during the CVD process. Reaction vessel 14 is used in both the CVI process and the CVD process. Reaction vessel 14 is a vessel that can maintain the necessary temperature and pressure requirements for the CVI or CVD process. Reaction vessel 14 includes exit 16 and entrance 18 to allow gasses to flow through reaction vessel 14 during the CVI or CVD process.

Exit 16 is connected to vacuum pump 20. After preform 12 is placed in reaction vessel 14, vacuum pump 20 evacuates reaction vessel 14 by removing air and other unwanted gasses through exit 16. Reaction vessel 14 is then backfilled through entrance 18 with a backfill gas from gas source tanks 22. The backfill gas is an inert gas, such as argon or nitrogen. Reaction vessel 14 is evacuated and backfilled several times. Evacuating and backfilling reaction vessel 14 with an inert gas multiple times reduces the amount of air and other oxidizing agents in reaction vessel 14 to a negligible amount. Oxidizing agents reduce the efficacy of the CVI process or the CVD process. Vacuum pump 20 also lowers and maintains the pressure in reaction vessel 14 to an operating pressure. Throughout the CVI or CVD process, vacuum pump 20 removes unspent precursor materials and spent materials, like off gasses, and excess gas from reaction vessel 14.

Reaction gasses, such as the backfill gas, precursor materials and carrier gas, are stored in gas source tanks 22. Gas source tanks 22 allow for separate storage of the backfill gas, the precursor materials, and the carrier gas. First tank 22a, second tank 22b, third tank 22c, and fourth tank 22d are connected first to flow meter 24 and then to entrance 18. The reaction gasses flow through flow meter 24 and into reaction vessel 14 through entrance 18. Flow meter 24 helps control the relative ratio of the reaction gasses entering reaction vessel 14. Controlling the relative ratio of the reaction gasses with flow meter 24 also helps control the pressure in reaction vessel 14.

Heaters 26 are heat sources. First heater 26a is located near gas source tanks 22 to heat the reaction gasses to a preheat temperature. Heating the reaction gasses to the preheat temperature decreases the temperature change the reaction gasses will make as they enter reaction vessel 14. This keeps the temperature of reaction vessel 14 more stable. Second heater 26b is located near reaction vessel 14 to heat reaction vessel 14 and preform 12. Heater 26b heats reaction vessel 14 and preform 12 to an operating temperature necessary for the CVI process or the CVD process. The CVI process and the CVD process require very high temperatures to effectively densify preform 12. First heater 26a and second heater 26b can be integrated with gas source tanks 22 and reaction vessel 14, respectively, or can be separate.

After reaction vessel 14 is at the operating temperature and the operating pressure, the precursor materials flow from gas source tanks 22 through flow meter 24 and into reaction vessel 14. The precursor materials are controlled by flow meter 24 so the precursor materials are introduced at a specified ratio into reaction vessel 14. The precursor materials diffuse to the surface of preform 12. The precursor materials will then absorb into preform 12. In the CVI process, the precursor materials absorb into the pores of preform 12. In the CVD process, the precursor materials absorb into the roughened surface of preform 12. Absorption is important to ensure the precursor materials have sufficient contact with preform 12 to react. During the CVI process, the precursor materials adsorb onto and react with the fibers of preform 12. This densifies preform 12 with silicon carbide to create the finished CMC product. During the CVD process, the precursor materials adsorb onto and react with the roughened surface of preform 12. This creates a silicon carbide coating on preform 12. Both the CVI process and the CVD process require desorption of extraneous gasses such as off gasses, reaction by-products, and unspent precursor materials to control the reactions. Vacuum pump 20 encourages desorption. Using vacuum pump 20 to help with desorption of the extraneous gasses increases the porosity of preform 12. An increased porosity on preform 12 allows for diffusion, absorption, and reaction to continually occur on preform 12 throughout the CVI process or the CVD process. Desorption also keeps the concentrations of the precursor materials in the specified ration within reaction vessel 14. Controlling the CVI process helps eliminate deposition of free silicon on the surface of preform 12. Silicon carbide will deposit in a ratio of one silicon atom to one carbon atom. This increases the quality of the finished product during a controlled CVI or CVD reaction.

FIG. 2 is a flow chart showing the steps of process 30 to reduce colorization on the surface of CMC products formed using a CVI process or a CVD process. Process 30, shown in FIG. 2, includes step 32, step 34, step 36, step 38, step 40, step 42, and step 44. Process 30 will be explained in relation to system 10 of FIG. 1.

Step 32 requires placing preform 12 into reaction vessel 14. For a CVI process, preform 12 is a porous silicon carbide fiber or carbon fiber material. One way to create preform 12 is by weaving silicon carbide fibers, carbon fibers, or a combination of the two fibers to create a fabric. Further, other suitable ceramic fibers can be used. For a CVD process, preform 12 is made of a material that can have a silicon carbide coating such as carbon, silicon carbide, metal, metal alloys and glass. Preform 12 will have a rough exterior surface to increase the surface area that can react during the CVD process. For either the CVI process or the CVD process, preform 12 is generally shaped like a finished product. For instance, if the finished product is a brake disk, preform 12 will be shaped like a brake disk. Reaction vessel 14 is a vessel suitable for process 30. Reaction vessel 14 must be able to maintain the temperature and pressure required for process 30. Reaction vessel 14 must also have exit and entrance points, such as exit 16 and entrance 18, for gasses to flow out of and into reaction vessel 14, respectively.

Step 34 requires removing air from reaction vessel 14 and backfilling reaction vessel 14 with an inert gas to an operating pressure. Removing the air from reaction vessel 14 can be accomplished by vacuum pump 20. Ambient air enters reaction vessel 14 during step 32. The air that enters reaction vessel 14 during step 32 includes oxidizing agents like oxygen, which reduce the effectiveness of chemical reactions that take place during process 30. Removing air from reaction vessel 14 with vacuum pump 20 through exit 16 and backfilling reaction vessel 14 with a backfilling gas lowers the concentration of oxidizing agents in reaction vessel 14 to negligible levels and replaces the air with the backfilling gas. The backfilling gas used in step 34 is an inert gas which will not react with the silicon carbide of preform 12 or densifying layers created by process 30. The backfilling gas is chosen from a group of gasses comprising nitrogen and argon. The backfilling gas can be stored in gas storage tanks 22. For example, the backfilling gas could be stored in first tank 22a. To enter reaction vessel 14, the backfilling gas flows from first tank 22a through flow meter 24. Flow meter 24 controls the flow rate of the backfilling gas and the pressure of the backfilling gas entering reaction vessel 14. From flow meter 24, the inert gas can flow into entrance 18 of reaction vessel 14. Step 34 creates a requisite operating pressure for process 30 within reaction vessel 14. Process 30 requires the operating pressure to be lower than atmospheric pressure. The operating pressure for process 30 is between 1 torr and 100 torr. The operating pressure is optimally between 3 torr and 30 torr for process 30.

Step 34 can be repeated multiple times to remove as much of the air as possible from reaction vessel 14. Process 30 needs to be done without oxidizing agents because oxidizing agents will oxidize the surface of the fibers of preform 12 and the layers of densified silicon carbide that build during process 30, reducing the quality of the finished CMC material. Oxidation on the surface of preform 12 and the layers of densified silicon carbide decreases the mechanical, thermal, and chemical properties of the finished product.

Step 36 requires heating reaction vessel 14 and preform 12 to an operating temperature. Process 30 requires an operating temperature between 900° C. and 1200° C. Heater 26b heats reaction vessel 14 and preform 12 to the operating temperature. Heating reaction vessel 14 to the operating temperature prepares preform 12 for the chemical reaction that takes place during process 30. Heating reaction vessel 14 also allows for the precursor materials and the carrier gas to warm to the operating temperature when entering reaction vessel 14 through entrance 18.

Step 38 requires heating precursor materials and a carrier gas to a preheat temperature. The precursor materials are those that will produce the silicon carbide layers in and on preform 12 during process 30. The precursor materials include hydrogen gas and methyltrichlorosilane (MTS). The precursor materials can be stored in source tanks 22. For example, a first precursor, such as hydrogen, could be in source tank 22b and a second precursor material, such as MTS, could be in source tank 22c. The carrier gas is a gas used to maintain the proper concentrations of precursor materials flowing into vessel 14 and help create the necessary operating pressure within reaction vessel 14 during process 30. The carrier gas should be a non-reactive gas, such as nitrogen or argon. The carrier gas can also be stored in source tanks 22. For example, the carrier gas could be stored in fourth tank 22d. The carrier gas can also be the same as the backfilling gas in step 34. Heater 26a heats source tanks 22 to the preheat temperature. The preheat temperature is a temperature above room temperature but below the operating temperature, such as 40° C. The preheat temperature needs to be less than the operating temperature to avoid the precursor materials reacting before entering reaction vessel 14 and contacting preform 12. Increasing the temperature of the precursor materials and the carrier gas to the preheat temperature reduces the change in temperature undergone as the carrier gas and precursor materials enter reaction vessel 14. This stabilizes the temperature of reaction vessel 14 and preform 12 throughout process 30. Step 34, step 36, and step 38 may be performed in any order or at the same time.

Step 40 requires introducing the carrier gas and the precursor materials to reaction vessel 14 in a specified ratio for a first time interval, wherein the precursor materials are in a specified ratio. The precursor materials flow from second tank 22b and third tank 22c to flow meter 24. Flow meter 24 regulates the relative amounts of the first precursor material (hydrogen) and the second precursor material (MTS) to mix the precursor materials in the specified ratio. A carrier gas from fourth tank 22d can also flow to flow meter 24 with the precursor materials. The precursor materials in the specified ratio and the carrier gas will then flow into reaction vessel 14. Once in reaction vessel 14, the precursor materials diffuse around and into preform 12. During CVI, the reaction materials will diffuse between the fibers and around all of the surfaces of preform 12. During CVD, the reaction materials will diffuse around all of the surfaces of preform 12. The specified ratio is a volumetric ratio of hydrogen to MTS that is between 15 parts hydrogen to 1 part MTS (15:1) and 65 parts hydrogen to 1 part MTS (65:1), where the flow rate of hydrogen is 15-65 times the flow rate of MTS. Preferably, the specified ratio should be between 15 parts hydrogen to 1 part MTS (15:1) and 35 parts hydrogen to 1 part MTS (35:1), where the flow rate of hydrogen is 15-35 times the flow rate of MTS. More preferably, the specified ratio should be 20 parts hydrogen to one part MTS (20:1). The specified ratio of hydrogen to MTS densifies preform 12 by forming a silicon carbide layer that is stoichiometrically equivalent to the chemistry of silicon carbide: one atom of silicon is deposited for every atom of carbon deposited.

Step 40 lasts a first time interval. The first time interval is an amount of time that will allow for CVI or CVD to occur without an extra buildup of hydrogen gas. During the first time interval, the pores of preform 12 undergoing CVI will absorb the precursor materials. The roughened surface of preform 12 undergoing CVD will absorb the precursor materials. Absorption is important because it ensures the precursor materials interact with the fibers or surfaces of preform 12 to form silicon carbide. The first time interval is a window that allows time for the precursor materials to diffuse around, absorb into, and react with preform 12. The first time interval is likely long because the reaction between preform 12 and the precursor materials to form silicon carbide is slow.

Step 42 requires removing off gasses, the precursor materials that are unspent, and the carrier gas from reaction vessel 14 to maintain the specified ratio of the precursor materials in reaction vessel 14 during the first time interval. As process 30 occurs, a silicon carbide layer will be formed on the surfaces of the fibers of preform 12 due to the reaction between preform 12 and the precursor materials. Off gasses are formed as byproducts of the reaction. The off gasses need to be removed from inside the pores of preform 12 and within reaction vessel 14 to continue the flow of the precursor materials into reaction vessel 14 and into and around preform 12. Further, the off gasses, unspent precursor materials, and excess carrier gas remaining in reaction vessel 14 change the ratio of gasses inside reaction vessel 14 from the specified ratio. The off gasses, unspent precursor materials, and excess carrier gas are removed from reaction vessel 14 through exit 16 by vacuum pump 20. This removal continues throughout the first time interval.

Step 44 requires stopping introduction of the precursor materials while removing excess hydrogen, off gasses, and unspent precursor materials from the reaction vessel for a second time interval. During process 30, levels of hydrogen can rise in reaction vessel 14. This creates conditions in reaction vessel 14 outside of the specified ratio. Using vacuum pump 20 to remove excess hydrogen, off gasses, and unspent precursor material, without introducing the reaction materials, helps maintain the specified ratio during process 30. Step 44 may not be necessary for all CVI or CVD processes because the specified ratio may be maintained for shorter processes. Longer CVD processes and most CVI processes will likely require step 44. Step 44 helps with desorption and increases the porosity of preform 12 so the precursor materials can continue reacting. After the second time interval, step 40, step 42, and step 44 may be repeated so process 30 is the appropriate time for the amount of deposition needed while also maintaining the specified ratio in reaction vessel 14.

Process 30 minimizes colorization on the CMC material end products of silicon carbide CVI and CVD reactions. Colorization on silicon carbide CMC material end products is a yellow or multi-colored sheen on the surfaces of the end products. This yellow or multi-colored sheen is caused by excess free silicon buildup on fibers of preform 12 during a CVI reaction. Microscopically, this excess free silicon buildup creates pearlizations on the surfaces or fibers of preform 12. The pearlizations are bumpy, flakey, or fluffy depositions on the surfaces or fibers of preform 12. The excess free silicon buildup increases the chance of oxidation of the CMC material end product. This increased oxidation decreases the thermal shielding properties of the finished CVI or CVD process. A finished CVI product with pearlizations and excess free silicon buildup has reduced mechanical properties because the friction coefficient is lower than it would be without the excess silicon formations. Process 30 minimizes excess silicon buildup by keeping the precursor materials in the specified ratio in the localized area around preform 12 throughout the CVI reaction. Carefully controlling the specified ratio of the precursor materials creates densification in preform 12 close to the stoichiometric coefficient of silicon carbide where one atom of silicon is deposited for every atom of carbon. Depositing in the stoichiometric coefficient ratio of 1:1 carbon to silicon eliminates excess free silicon deposits. Densifying preform 12 with the correct stoichiometric ratio decreases pearlizations and the excess free silicon buildup thereby ridding the end product of colorization.

DISCUSSION OF POSSIBLE EMBODIMENTS

The following are non-exclusive descriptions of possible embodiments of the present invention.

A method of depositing silicon carbide on a preform to form a ceramic matrix composite. The method includes placing the preform into a reaction vessel, removing air from the reaction vessel and backfilling the reaction vessel with an inert gas, heating the reaction vessel and the preform to an operating temperature, heating the carrier gas and precursor materials to a preheat temperature outside of the reaction vessel. The method further includes introducing the carrier gas and the precursor materials to the reaction vessel, wherein the precursor materials are introduced in a specific ratio and removing off gasses, the precursor materials that are unspent, and the carrier gas from the reaction vessel to maintain the specified ratio of the precursor materials in the reaction vessel.

The method of the preceding paragraph can optionally include, additionally and/or alternatively, any one or more of the following features, configurations and/or additional components:

The method further includes depositing a layer of silicon carbide on the preform with a chemical ratio of 1 atom of silicon to 1 atom of carbon.

The method further includes stopping the flow of the precursor materials to the reaction vessel while removing the precursor materials that are unspent from the reaction vessel.

The preform is made of a solid material that can have a silicon carbide coating selected from the group consisting of carbon, silicon carbide, metal, metal alloys, and glass.

The preform is a fiber preform made of fibers selected from the group consisting of silicon carbide fibers, carbon fibers, and combinations thereof.

The precursor materials comprise hydrogen and methyltrichlorosilane, and wherein the specified ratio of the hydrogen to the methyltrichlorosilane is a volumetric ratio between 15 parts hydrogen to 1 part methyltrichlorosilane (15:1) and 65 parts hydrogen to 1 part methyltrichlorosilane (65:1), is preferably between 15 parts hydrogen to 1 part methyltrichlorosilane (15:1) and 35 parts hydrogen to 1 part methyltrichlorosilane (35:1), and is preferably 20 parts hydrogen to 1 part methyltrichlorosilane (20:1).

The carrier gas and the inert gas are selected from the group consisting of nitrogen, argon, and combinations thereof.

The preheat temperature is about 40° C.

The operating temperature is between 900° C. and 1200° C.

The operating pressure is between 1 torr and 100 torr and is preferably between 3 torr and 30 torr.

A method of depositing silicon carbide on a preform to form a ceramic matrix composite. The method includes placing the preform into a reaction vessel, filling the reaction vessel with an inert gas to reach an operating pressure, and heating the reaction vessel and the preform to an operating temperature. The method further includes introducing hydrogen and methyltrichlorosilane to the reaction vessel in a specified ratio. The specified ratio of the hydrogen to the methyltrichlorosilane is a volumetric ratio between 15 parts hydrogen to 1 part methyltrichlorosilane (15:1) and 65 parts hydrogen to 1 part methyltrichlorosilane (65:1).

The method of the preceding paragraph can optionally include, additionally and/or alternatively, any one or more of the following features, configurations and/or additional components:

The method further includes depositing a layer of silicon carbide on the preform with a chemical ratio of 1 atom of silicon to 1 atom of carbon.

The method further includes introducing a carrier gas to the reaction vessel with the hydrogen and the methyltrichlorosilane.

The method further includes removing off gasses, the hydrogen and the methyltrichlorosilane that are unspent, and the carrier gas from the reaction vessel to maintain the specified ratio of the hydrogen to the methyltrichlorosilane in the reaction vessel.

The method further includes stopping the flow of the hydrogen and the methyltrichlorosilane to the reaction vessel while removing the hydrogen and the methyltrichlorosilane that are unspent from the reaction vessel.

The preform is made of a solid material that can have a silicon carbide coating selected from the group consisting of carbon, silicon carbide, metal, metal alloys, and glass.

The preform is a fiber preform made of fibers selected from the group consisting of silicon carbide fibers, carbon fibers, and combinations thereof.

The specified ratio of the hydrogen to the methyltrichlorosilane is a volumetric ratio between 15 parts hydrogen to 1 part methyltrichlorosilane (15:1) and 65 parts hydrogen to 1 part methyltrichlorosilane (65:1), and is preferably 20 parts hydrogen to 1 part methyltrichlorosilane (20:1).

The carrier gas and the inert gas are selected from the group consisting of nitrogen, argon, and combinations thereof.

The preheat temperature is about 40° C.

The operating temperature is between 900° C. and 1200° C.

The operating pressure is between 1 torr and 100 torr and is preferably between 3 torr and 30 torr.

A method of depositing silicon carbide on a preform to form a ceramic matrix composite. The method includes placing the preform into a reaction vessel and then removing air from the reaction vessel and backfilling the reaction vessel with an inert gas to reach an operating pressure. Precursor materials are introduced to the reaction vessel in a specified ratio for a first time interval. The flow of the precursor materials to the reaction vessel is stopped while the precursor materials that are unspent are removed from the reaction vessel for a second time interval. The precursor materials are introduced to the reaction vessel for a third time interval.

The method of the preceding paragraph can optionally include, additionally and/or alternatively, any one or more of the following features, configurations and/or additional components:

The method further includes depositing a layer of silicon carbide on the preform with a chemical ratio of 1 atom of silicon to 1 atom of carbon.

The method further includes introducing a carrier gas to the reaction vessel with the precursor materials.

The method further includes removing off gasses, the precursor materials that are unspent, and the carrier gas from the reaction vessel to maintain the specified ratio of the precursor materials in the reaction vessel during the first time interval.

The method further includes removing off gasses, the precursor materials that are unspent, and the carrier gas from the reaction vessel to maintain the specified ratio of the precursor materials in the reaction vessel during the third time interval.

The preform is made of a solid material that can have a silicon carbide coating selected from the group consisting of carbon, silicon carbide, metal, metal alloys, and glass.

The preform is a fiber preform made of fibers selected from the group consisting of silicon carbide fibers, carbon fibers, and combinations thereof.

The precursor materials comprise hydrogen and methyltrichlorosilane, and wherein the specified ratio of the hydrogen to the methyltrichlorosilane is a volumetric ratio between 15 parts hydrogen to 1 part methyltrichlorosilane (15:1) and 65 parts hydrogen to 1 part methyltrichlorosilane (65:1), is preferably between 15 parts hydrogen to 1 part methyltrichlorosilane (15:1) and 35 parts hydrogen to 1 part methyltrichlorosilane (35:1), and is preferably 20 parts hydrogen to 1 part methyltrichlorosilane (20:1).

The carrier gas and the inert gas are selected from the group consisting of nitrogen, argon, and combinations thereof.

The preheat temperature is about 40° C.

The operating temperature is between 900° C. and 1200° C.

The operating pressure is between 1 torr and 100 torr and is preferably between 3 torr and 30 torr.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of depositing silicon carbide on a preform to form a ceramic matrix composite, the method comprising:
   placing the preform into a reaction vessel;
   removing air from the reaction vessel and backfilling the reaction vessel with an inert gas to an operating pressure;
   heating the reaction vessel and the preform to an operating temperature;
   heating a carrier gas and precursor materials to a preheat temperature outside of the reaction vessel;
   introducing the carrier gas and the precursor materials in a specified ratio to the reaction vessel, wherein the precursor materials comprise hydrogen and methyltrichlorosilane;
   depositing a layer of silicon carbide on the preform, wherein excess free silicon deposition on the preform is minimized by introducing the precursor materials in the specified ratio; and
   removing off gasses, excess hydrogen, unspent precursor materials, and the carrier gas from the reaction vessel to maintain the specified ratio of the precursor materials in the reaction vessel;
   wherein the specified ratio is a volumetric ratio of the hydrogen to the methyltrichlorosilane, and wherein the specified ratio is between 15 parts hydrogen to 1 part methyltrichlorosilane and 65 parts hydrogen to 1 part methyltrichlorosilane.

2. The method of claim 1, wherein the method further comprises:
   stopping flow of the precursor materials to the reaction vessel while removing the precursor materials that are unspent from the reaction vessel.

3. The method of claim 1, wherein the preform is made of a solid material that can have a silicon carbide coating selected from the group consisting of carbon, silicon carbide, metal, metal alloys, and glass.

4. The method of claim 1, wherein the preform is a fiber preform made of fibers selected from the group consisting of silicon carbide fibers, carbon fibers, and combinations thereof.

5. The method of claim 1, wherein the specified ratio is between 15 parts hydrogen to 1 part methyltrichlorosilane and 35 parts hydrogen to 1 part methyltrichlorosilane.

6. The method of claim 5, wherein the specified ratio is about 20 parts hydrogen to 1 part methyltrichlorosilane.

7. The method of claim 1, wherein the carrier gas and the inert gas are selected from the group consisting of nitrogen, argon, and combinations thereof.

8. The method of claim 1, wherein the operating temperature is between 900° C. and 1200° C.

9. The method of claim 1, wherein the operating pressure is between 1 torr and 100 torr.

10. The method of claim 9, wherein the operating pressure is between 3 torr and 30 torr.

11. A method of depositing silicon carbide on a preform to form a ceramic matrix composite, the method comprising:
    placing the preform into a reaction vessel;
    filling the reaction vessel with an inert gas to reach an operating pressure;
    heating the reaction vessel and the preform to an operating temperature; and
    introducing hydrogen and methyltrichlorosilane to the reaction vessel in a specified ratio, wherein the specified ratio of the hydrogen to the methyltrichlorosilane is a volumetric ratio between 15 parts hydrogen to 1 part methyltrichlorosilane and 35 parts hydrogen to 1 part methyltrichlorosilane;
    depositing a layer of silicon carbide on the preform with a chemical ratio of 1 atom of silicon to 1 atom of carbon, wherein excess free silicon deposition on the preform is minimized by introducing the precursor materials in the specified ratio; and
    maintaining the specified ratio of hydrogen and methyltrichlorosilane by removing excess hydrogen from the reaction vessel to reduce free silicon deposits on the silicon carbide.

12. The method of claim 11, wherein maintaining the specified ratio of hydrogen and methyltrichlorosilane to reduce the free silicon buildup on the layer of silicon carbide comprises:
    removing off gasses, unspent methyltrichlorosilane, and the carrier gas from the reaction vessel to maintain the specified ratio of the hydrogen to the methyltrichlorosilane in the reaction vessel; and
    stopping flow of the hydrogen and the methyltrichlorosilane to the reaction vessel while removing the hydrogen and the unspent methyltrichlorosilane from the reaction vessel to maintain the specified ratio.

13. The method of claim 11, wherein the preform is a fiber preform and the fibers are selected from the group consisting of silicon carbide fibers, carbon fibers, and combinations thereof.

14. The method of claim 11, wherein the specified ratio is about 20 parts hydrogen to 1 part methyltrichlorosilane.

15. A method of depositing silicon carbide on a preform to form a ceramic matrix composite, the method comprising:

placing the preform into a reaction vessel;

removing air from the reaction vessel and backfilling the reaction vessel with an inert gas to reach an operating pressure;

heating the reaction vessel and the preform to an operating temperature;

introducing precursor materials to the reaction vessel in a specified ratio for a first time interval;

stopping flow of the precursor materials to the reaction vessel while removing excess hydrogen, unspent precursor materials, and excess free silicon from the reaction vessel for a second time interval, wherein stopping the flow of precursor materials maintains the specified ratio;

introducing the precursor materials to the reaction vessel in the specified ratio for a third time interval; and depositing silicon carbide on the preform with a chemical ratio of 1 atom of silicon to 1 atom of carbon;

wherein the precursor materials comprise hydrogen and methyltrichlorosilane;

wherein the specified ratio is a volumetric ratio of hydrogen to methyltrichlorosilane, and wherein the specified ratio of the hydrogen to the methyltrichlorosilane is between 15 parts hydrogen to 1 part methyltrichlorosilane and 35 parts hydrogen to 1 part methyltrichlorosilane; and wherein maintaining the specified ratio reduces buildup of excess silicon on the silicon carbide.

16. The method of claim 15, wherein the operating pressure is between 1 torr and 100 torr.

17. The method of claim 15, wherein a carrier gas is introduced into the reaction vessel during the first time interval, the second time interval, and the third time interval.

18. The method of claim 15, wherein the specified ratio is 20 parts hydrogen to 1 part methyltrichlorosilane.

* * * * *